US006980975B2

(12) United States Patent
Reed et al.

(10) Patent No.: US 6,980,975 B2
(45) Date of Patent: Dec. 27, 2005

(54) METHOD AND APPARATUS FOR RULE-BASED RANDOM IRRITATOR FOR MODEL STIMULUS

(75) Inventors: Charlotte Anne Reed, Underhill, VT (US); John Sargis, Jr., Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 770 days.

(21) Appl. No.: 09/998,400

(22) Filed: Nov. 15, 2001

(65) Prior Publication Data

US 2003/0093773 A1    May 15, 2003

(51) Int. Cl.[7] ............................ G06F 15/18; G06F 9/44
(52) U.S. Cl. ........................................ 706/47; 717/135
(58) Field of Search ......................... 706/47; 717/120, 717/135, 138; 703/13, 14, 21; 714/25, 712

(56) References Cited

U.S. PATENT DOCUMENTS

| | | | | |
|---|---|---|---|---|
| 4,750,175 A | * | 6/1988 | Brenneman et al. | 370/216 |
| 4,792,753 A | * | 12/1988 | Iwai | 370/244 |
| 4,817,092 A | * | 3/1989 | Denny | 714/10 |
| 4,873,678 A | * | 10/1989 | Nakamura et al. | 369/13.29 |
| 4,881,230 A | * | 11/1989 | Clark et al. | 714/712 |
| 5,255,211 A | * | 10/1993 | Redmond | 703/6 |
| 5,375,126 A | * | 12/1994 | Wallace | 714/712 |
| 5,481,548 A | * | 1/1996 | Wallace | 714/712 |
| 5,528,748 A | * | 6/1996 | Wallace | 714/25 |
| 5,980,256 A | * | 11/1999 | Carmein | 434/55 |
| 6,074,426 A | * | 6/2000 | Baumgartner et al. | 703/13 |
| 6,484,062 B1 | * | 11/2002 | Kim | 700/90 |

OTHER PUBLICATIONS

Integrating expert system diagnostics within ATE system software Buck, F.L.; AUTOTESTCON '90. IEEE Systems Readiness Technology Conference. 'Advancing Mission Accomplishment', Conference Record. , Sep. 17-21, 1990 pp.: 85-92.*

Integration techniques for VXIbus instrumentation systems Gallagher, A.M.; AUTOTESTCON '90. IEEE Systems Readiness Technology Conference. 'Advancing Mission Accomplishment', Conference Record. , Sep. 17-21, 1990 pp.: 183-185.*

An experimental conformance test system of home automation system Aoki, T.; Nakatsubo, T.; Minagawa, Y.; Watanabe, Y.; □□Consumer Electronics, IEEE Transactions on , vol.: 34 , Issue: 3 , Aug. 1988 pp. : 723-727.*

Integrated TCP/IP protocol software testing for vulnerability detection Shu Xiao; Lijun Deng; Sheng Li; Xiangrong Wang;□□Computer Networks and Mobile Computing, 2003. ICCNMC 2003. 2003 International Conference on , Oct. 20-23, 2003 □□pp.: 311-319.*

(Continued)

Primary Examiner—Wilbert L Starks, Jr.
Assistant Examiner—Michael B. Holmes
(74) Attorney, Agent, or Firm—Carr LLP; Diana R. Gerhardt

(57) ABSTRACT

For testing a logic unit under test (UUT), rule-based random irritation of a UUT model is provided to be used in conjunction with a simulator. The UUT model is stimulated (or irritated) with data patterns randomly generated by a pattern generator within the boundary of limitations imposed by a rules list. The rules list provides restrictions or encouragements on how data patterns are to be applied to the software model of the UUT. The pattern generator may be implemented either within or outside the simulator. If the pattern generator is incorporated into the simulator, then a software environment is required to interface communications between the pattern generator, the simulator, and other software entities involved in the simulation.

24 Claims, 4 Drawing Sheets

OTHER PUBLICATIONS

A virtual interface bus for portable PCs Burris, D.; Cargile, F.M.; Dalton, A.; AUTOTESTCON '99; IEEE Systems Readiness Technology Conference, 1999. IEEE , Aug. 30-Sep. 2, 1999 pp.: 81-86.*

Tradeoff decisions made for a P1149.1 controller design [ATE] Vining, S.; Test Conference, 1989. Proceedings. 'Meeting the Tests of Time'., International , Aug. 29-31, 1989 pp.: 47-54.*

Hybrid diagnostic strategy for an expert system controlled automatic test system (EXATS) Pflueger, K.W.; Aerospace and Electronic Systems Magazine, IEEE , vol.: 4 , Issue: 10 , Oct. 1989 pp.: 25-30.*

Using neural networks for functional testing Kirkland, L.V.; Wright, R.G.; AUTOTESTCON '95. 'Systems Readiness: Test Technology for the 21st Century', Conference Record , Aug. 8-10, 1995 pp.: 508-511.*

* cited by examiner

METHOD AND APPARATUS FOR RULE-BASED RANDOM IRRITATOR FOR MODEL STIMULUS

BACKGROUND OF THE INVENTION

1. Field of the Invention

The invention relates generally to logic testing using a computer program and, more particularly, to rule-based random irritation of a software model of a logic unit under test (UUT).

2. Description of the Related Art

During the design phase of complex logic circuitry such as a microprocessor, such circuitry is broken down into individual units, which must be designed to a specification. Logic designers create these units in a programming language called Hardware Description Language (HDL) such as VHDL, or VHSIC (Very High Speed Integrated Circuit) HDL, based on the specification given to them. But errors might be introduced in the design, causing the unit not to conform to the specification. These errors, or bugs, can cause problems in the unit itself, or propagate errors to other units, causing the processor to be unstable or unusable. The types of errors introduced could be logical errors (e.g., 1+1=3) or errors based on misinterpretation of the specification.

To find these errors, a process of verification is used. Verification is a separate part of the design phase where the units created by the logic designers are tested. A verification engineer's job is to stress the unit to expose situations where the unit does not adhere to its specification.

The actual mechanics of testing logic units can vary. One method is to build a software model of the unit. The model is usually built to conform to a simulator. Typically, such a simulator loads the model and has the capability to stimulate and read any net, such as an internal signal, group of several signals, or input/output pin of the unit, within the model. The type of simulator can be event-driven (the model changes state when a signal changes state) or cycle-based (each connection of the model is evaluated every clock cycle of the simulation).

Once the simulator loads the software model, the model must be stimulated. To accomplish this, a software environment can be used to direct the simulator. The software environment reads a testcase. A testcase is a list of commands to initialize the software test environment, commands for the model, and result information.

During a software model simulation, the software model is loaded into the simulator, and the software environment loads the testcase. The software environment begins parsing the testcase, and when it comes upon a command to be issued to the software model, it sends commands to the simulator to apply stimulus to the model's inputs or to get values from the model's outputs. The software environment then acts on any information it received from the model's outputs to check the state of the software model. This process repeats for every command in the testcase.

When the end of the testcase comes, the software environment usually checks the state of registers, output signals, and/or RAM contents of the model to the expected states of these items provided in the testcase to verify the model ran the testcase correctly. If the state of the software model does not match the expected state given in the testcase, the software environment flags the error.

In order for the software environment to interact with the simulator, an irritator must be created inside the software environment. This irritator must act like the logic unit that feeds the logic unit under test (UUT). Normally, there would be another unit (or units) driving these inputs. Since the unit driving the UUT is not in the model, the software environment must mimic its duties and drive the UUT's inputs.

The input pins of a UUT have a protocol (dictated by the specification) by that any stimulus to them must follow. For example, a UUT has 10 input pins designated as an operand field, 5 input pins for an instruction field, and 30 input pins as a control field, for a total of 55 input pins. The specification says each of these 3 fields has its own rules by which they can be stimulated. In this example, the specification for the UUT indicates that the instruction field has 10 valid values. However, the instruction field of the UUT has 5 pins which translates into 32 different possible values. Since only 10 of the 32 are valid, the verification engineer must ensure this rule is complied with during simulation. Therefore, the irritator for this UUT must ensure that only the 10 valid values of the instruction field are asserted to the 5 instruction field pins of the UUT.

The irritator within the software environment must abide by the specification of the UUT when driving its inputs. If a flaw exists within the irritator, the flaw is inherently passed on to the UUT.

Since the irritator for the UUT must be created by a person, it is open to human errors, just like the logic UUT it is trying to test.

Another problem with the aforementioned method of testing the UUT is that it may take quite a long time to develop an irritator. For most modem microprocessors, the units which make them up are complex, with very exacting specifications. The irritators needed to drive these units can be equally complex. Hence, time spent in developing the irritator is time lost on simulation of the UUT.

Therefore, there is a need for an irritator or an equivalent thereof that is less prone to human errors and takes less time to generate than a conventional irritator.

SUMMARY OF THE INVENTION

According to one embodiment of the present invention, a computer program product is provided for rule-based random irritation of a UUT model in a simulation of a UUT. The UUT model is a software model of the UUT, and the computer program product has a medium with a computer program embodied thereon. The computer program comprises an extractor program code for extracting one or more inputs and one or more outputs of the UUT. The computer program also comprises a pattern generator program code for generating data patterns to be applied to the UUT model in accordance with a rules list and information on the one or more inputs and the one or more outputs of the UUT. The rules list provides information on how the data patterns are to be applied to the UUT model. The computer program further comprises a simulator program code for applying the data patterns to the UUT model, and a software environment program code for interfacing communications between the extractor program code, the pattern generator program code, and the simulator program code.

In another embodiment of the present invention, a method is provided for rule-based random irritation of a UUT model in a simulation of a UUT. As mentioned above, the UUT model is a software model of the UUT. The simulation has one or more events. The method comprises the step of generating a rules list. The rules list provides information on how the data patterns are to be applied to the UUT model. The method further comprises the step of generating a data pattern, for an even of the simulation, in accordance with the rules list and information on one or more inputs and one or more outputs of the UUT. Additionally, the method comprises the steps of performing each even by applying the respective data pattern to the UUT model, and determining whether all events of the simulation are performed.

In still another embodiment of the present invention, an apparatus is provided for rule-based random irritation of a UUT model in a simulation of a UUT. As mentioned above, the UUT model is a software model of the UUT. The simulation has one or more events. The apparatus comprises means for generating a rules list. The rules list provides information on how the data patterns are to be applied to the UUT model. The apparatus further comprises means for generating a data pattern, for an event of the simulation, in accordance with the rules list and information on one or more inputs and one or more outputs of the UUT. Additionally, the apparatus comprises means for performing each event by applying the respective data pattern to the UUT model, and means for determining whether all events of the simulation are performed.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

The principles of the present invention and their advantages are best understood by referring to the illustrated operations of embodiment depicted in FIGS. 1–6.

Figure 1:
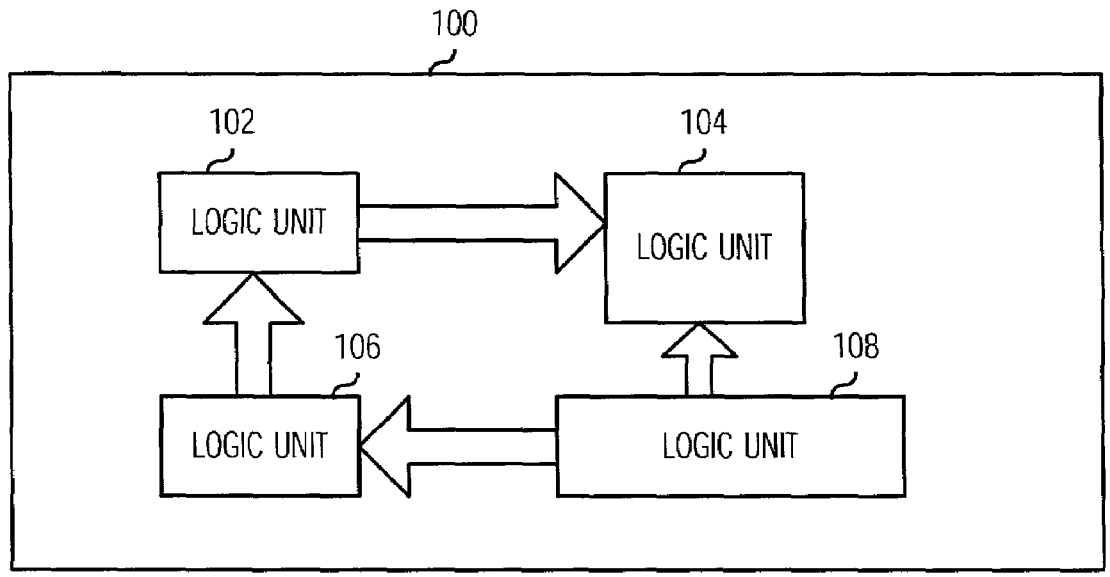
FIG. 1 depicts a block diagram showing a complex logic block.

In FIG. 1, a reference numeral 100 designates a complex logic block, such as a microprocessor, having a plurality of logic units in accordance with one embodiment of the present invention. A logic unit 102 is connected to a logic unit 104 for receiving signals from the unit 102. Similarly, the logic unit 102 is connected to a logic unit 106 for receiving signals from the logic unit 106. Likewise, the logic units 104 and 106 are connected to a unit 108 for receiving signals from the unit 108. The complex logic block 100 may have more or fewer units than illustrated.

Figure 2:
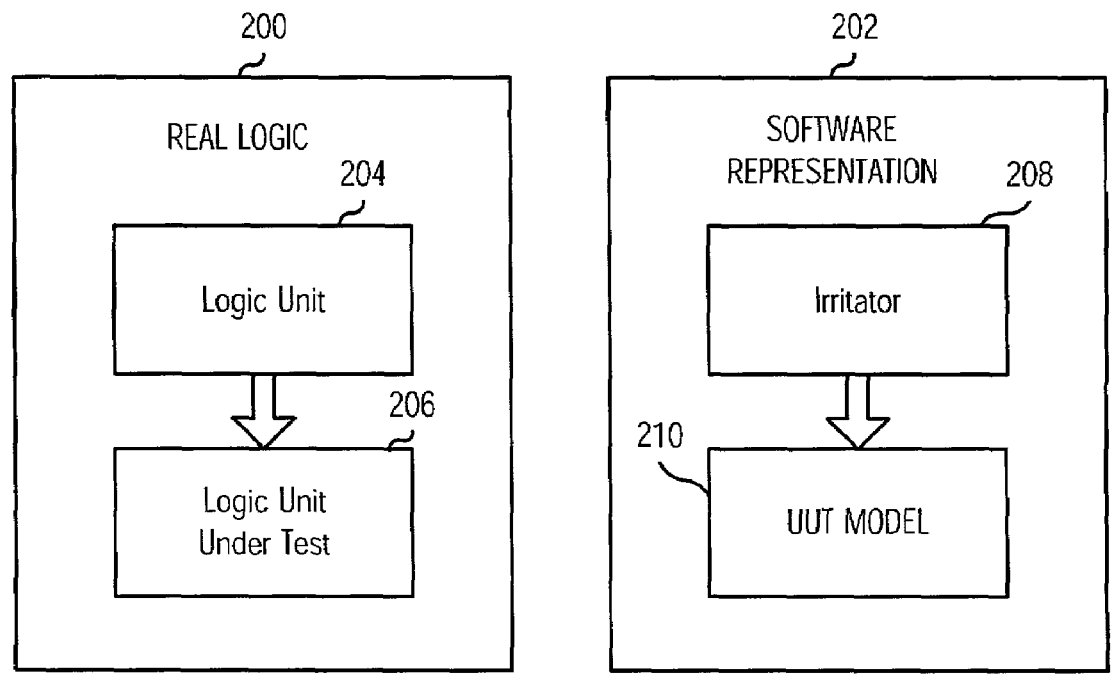
FIG. 2 depicts a block diagram showing a real logic block and a prior art software model corresponding thereto.

Now referring to FIG. 2, a real logic 200 is compared to a software representation 202 corresponding to the real logic 200. The real logic 200 contains two logic units 204 and 206. The logic unit 206 is connected to the logic unit 204 for receiving signals from the logic unit 204. In this example, the logic unit 206 is a logic unit under test (UUT), whereas the logic unit 204 is a logic unit feeding inputs to the logic unit 206. This relationship between the logic units 204 and 206 is found in the logic units 102 and 104, for example, of FIG. 1. The software representation 202 contains an irritator 208 feeding inputs to a UUT model 210. The UUT model 210 is a software model of the UUT 206. A software model is a software file that represents all the functionality of a logic unit, from which the software model was created, and is generally created for a simulator. Typically, a computer program such as a compiler reads hardware description language (HDL) files and converts them into computer files (i.e., software models) which the simulator can interact with. The irritator 208 acts like the logic unit 204 that feeds the logic unit 206. Normally, there would be another unit (or units), such as the unit 204, driving these inputs. Since the unit 204 driving the logic unit 206 is not included in the UUT model 210, a software environment (not shown) must mimic its duties and drive the inputs of the UUT model 210.

Figure 3:
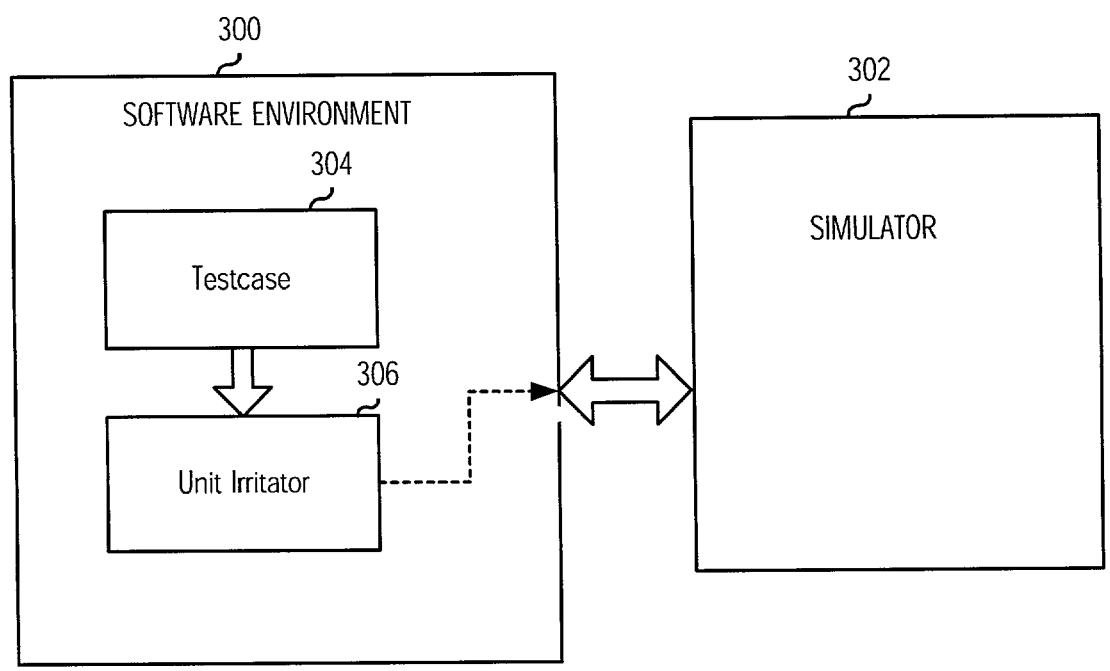
FIG. 3 depicts a block diagram showing a prior art setup for a software environment to interact with a simulator.

In FIG. 3, a prior art software environment 300 is shown to interact with a simulator 302. The software environment 300 has a testcase 304. A unit irritator 306 is also included in the software environment 300 and connected to the testcase 304 for receiving therefrom information on testcases. The testcase 304 preferably comprises a list of commands, and contains information to initialize the software environment 300, commands for the model, and result information.

The unit irritator 306 is preferably program code and is conventionally created by a design engineer. The unit irritator 306 is generally incorporated into the software environment 300 in order for the software environment 300 to interact with the simulator 302.

Figure 4:
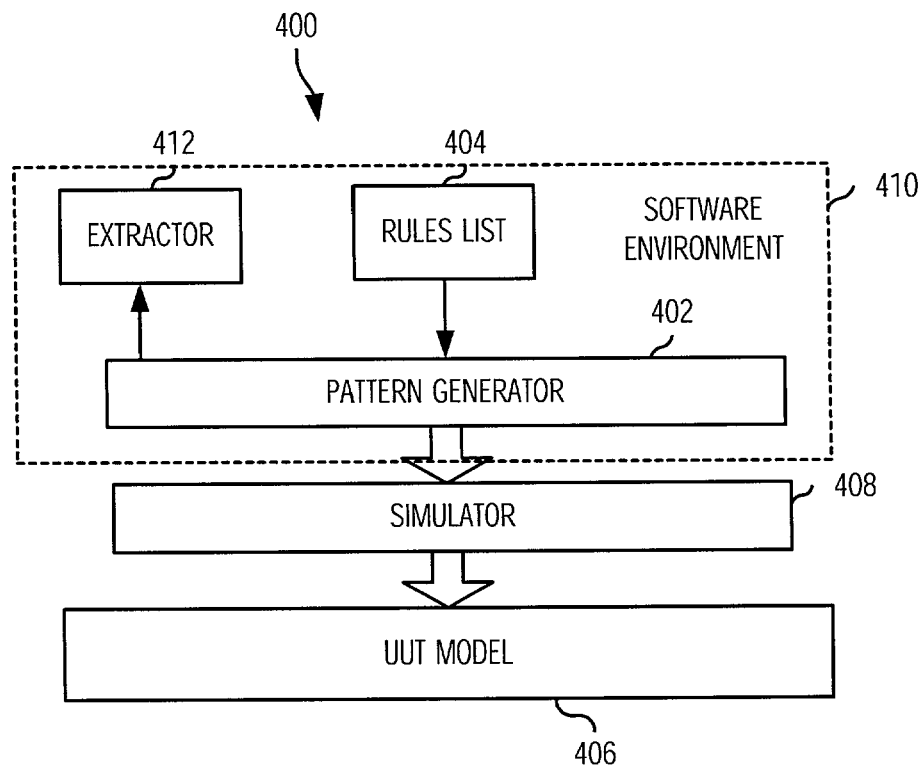
FIG. 4 depicts a block diagram showing a first embodiment of the present invention.

Now referring to FIG. 4, a block diagram 400 depicts one embodiment of rule-based random irritation of a UUT model. Specifically, the block diagram 400 shows signal and data flows for rule-based random irritation of a UUT model, where a pattern generator is not incorporated in a simulator. In the block diagram 400, a pattern generator 402 is connected to a rules list 404 for receiving information on how to generate data patterns that are to be applied to a UUT model 406. A simulator 408 is connected to the pattern generator 402 for receiving data patterns generated by the pattern generator 402. A software environment 410 is shown to encompass the pattern generator 402, the rules list 404, the simulator 408, and an extractor 412. A UUT model 406 is a software model of a UUT (not shown in FIG. 4) such as the units 102, 104, 106, and 108 of FIG. 1, and the unit 206 of FIG. 2. The extractor 412 is a computer program connected to the pattern generator 402 for receiving instructions therefrom to extract the inputs and/or outputs of the UUT represented by the UUT model 406.

Preferably, a software environment 410 is an environment which reads, writes, and interprets files for stimulating inputs and/or reading outputs of a UUT represented by the UUT model 406. Additionally, the software environment 410 contains other software objects that run independently of the UUT model 406 and uses information from the UUT model 406 to judge the state of the UUT model 406. Preferably, the software environment 410 contains a translator (not shown) needed to send data patterns generated by the pattern generator 402 to the simulator 408 in a language that the simulator understands.

In a preferred embodiment of the invention, the software environment 410 will be given directory paths such as a path to the UUT model 406, a path to the extractor 412, path(s) to hardware description language files (not shown) from which the UUT model 406 is derived, a path to the pattern generator 402, and a path to the simulator 408. When the simulator 408 is initiated, the software environment 410 will call the extractor 412 used for extracting the inputs and/or outputs of a UUT represented by the UUT model 406. When the software environment 410 calls the extractor 412, the software environment 410 will pass to the extractor 412 the path to the hardware description language files, or similar files that describe the logic of the UUT model 406. The extractor 412 will extract the inputs and/or outputs of a UUT represented by the UUT model 406 from such hardware description language files, and create an I/O file (not shown). The I/O file lists the inputs, followed by a separator, and then list the outputs. This order can be changed, however, without departing from the spirit of the present invention. The I/O file will be input to the pattern generator 402 and the simulator 408.

When the software environment 410 acknowledges the completion of creating the I/O file, the software environment 410 will start the simulation of the UUT model 406. Preferably, the pattern generator 402 will be prompted by the simulation environment 410 to create a seed (not shown) which it will use when generating random data patterns. The seed will be saved in an output file (not shown) of the simulator and/or the simulation environment, for the purpose of recreating the data patterns used in the current simulation. Optionally, the output file may also be accessed by the pattern generator 402. The pattern generator 402 will access the I/O file, and the UUT's inputs and/or outputs will be obtained.

The rules list 404 will also be loaded into the pattern generator 402. The rules list 404 provides restrictions or encouragements on how data patterns generated by the pattern generator 402 are to be applied to the UUT model 406. For example, a UUT represented by the UUT model 406 has 10 input pins designated as an operand field, 5 input pins for an instruction field, and 30 input pins as a control field, for a total of 55 input pins. Since there are 5 input pins for the instruction field, 32 possible values of 5 data values can be created. If the specification says only 10 of these 32 possible values maybe applied to the UUT, however, the rules list 404 will contain this information. The syntax of this information can take any form interpretable by the pattern generator 402. Hence, the specification from which the UUT was designed will be translated into the syntax of the rules list 404, and contained within the rules list 404.

The rules list 404 contains individual entries that list inputs or groups of inputs, and the restriction or encouragement for these inputs. Each individual entry within the rules list 404 is called a rule. The basic duty of the rules list 404 is to ensure that the specification of the UUT with respect to its inputs is upheld, and that the pattern generator 402 does not generate data patterns violating the specification. To accomplish this, one or more rules are specified. The rules list 404 can be created by hand or by a separate computer program. The rules list 404 is not required to contain any specific rules. The rules list 404 may even be devoid of any rules, in which case the specification of the UUT inputs has no specific limitation in applying the inputs. In addition, the rules list 404 may also contain the information needed to inform the software environment 410 or the simulator 408 to end the simulation.

Since the rules list 404 is used to control how the pattern generator 402 generates input data patterns, any net of the UUT model 406 can be constrained to specific patterns, values, or encouragements. An encouragement specifies a weight for a desired data pattern to be applied to a net within the UUT model 406. For example, if a group of four signals may have only one signal be a logical 1, whereas the others must be a logical 0, the rules list 404 has a rule to randomly make one of these four inputs a logical 1. Alternatively, the rule could specify a signal to be a logical 1 and specify the remaining three signals to be a logical 0. Still another way of meeting the condition is that the rule encourages the first signal to be a logical 1 80% of the time and the last signal to be a logical 1 20% of the time.

The rules list 404 also has the capability of specifying data patterns based on past events. For example, a rule of this type would be to restrict a signal from being a logical 1 only after it or some other signals(s) was a logical 1 two time intervals in the past. The rules list 404 is written in syntax that the pattern generator 402 can parse. The specifics of the syntax are not restricted in any way except that the names for the I/O signals listed in the rules list should be the same names as those listed in the hardware description language files. This will help ensure consistency throughout the simulation environment.

For each event of the simulation, the software environment 410 will prompt the pattern generator 402 to generate a data pattern. Then, the pattern generator 402 will parse the rules list 404. For each rule (not shown) listed in the rules list 404, net names affected by the rule will be assigned a value dictated by the rule. A net (not shown) is a junction of one or more signal connections existing in the UUT model 406, and may be a signal I/O, a single signal within the internals of the UUT model 406, or a connection of several signals contained in the UUT model 406. For the remaining nets not associated with a rule, random values will be created. The software environment 410 interprets, and passes to the simulator 408 the data pattern and corresponding input signals of a UUT represented by the UUT model 406. The simulator 408 will apply this data pattern to the corresponding signals of the UUT. This process will continue for each event of the simulation.

Since the pattern generator 402 already has the inputs and/or outputs of the UUT as well as the rules list 404, loading those files may not be necessary. Only a data pattern need be generated and passed to the software environment 410.

Any simulator output information can be recorded in the output file or other files not shown in FIG. 4. Also, the data patterns generated by the pattern generator 402 may be input to the output file. Additionally, other program objects (not shown) may be created within the software environments 410. These program objects may include unit checkers, I/O interface control checkers, array objects, and so on. Their outputs may also be recorded in the output file or an additional output file (not shown).

Figure 5:
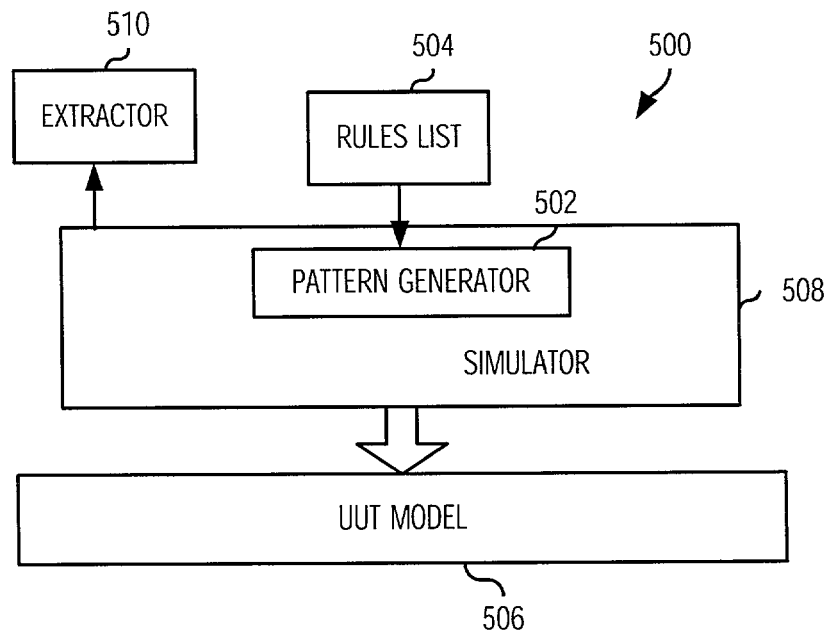
FIG. 5 depicts a block diagram showing a second embodiment of the present invention.

Now referring to FIG. 5, a block diagram 500 depicts another embodiment of rule-based random irritation of a UUT model. Specifically, the block diagram 500 shows signal and data flows for rule-based random irritation of a UUT model, where a pattern generator is incorporated in a simulator. In the block diagram 500, a pattern generator 502 is connected to a rules list 504 for receiving information on how to generate data patterns that will be applied to a UUT model 506. A simulator 508 comprises the pattern generator 502 for generating data patterns. In one embodiment, all the functionality of the pattern generator 502 may be subsumed in the simulator 508. For the sake of clarity, however, the pattern generator 502 is identified within the simulator 508. A UUT model 506 is a software model of an actual UUT (not shown in FIG. 5) such as the units 102, 104, 106, and 108 of FIG. 1, and the unit 206 of FIG. 2. An extractor 510 is a computer program connected to the simulator 508 for receiving instructions therefrom to extract the inputs and/or outputs of a UUT (not shown) represented by the UUT model 506.

Preferably, the simulator 508 will be given directory paths such as a path to the UUT model 506, a path to the extractor 510, and the path(s) to hardware description language files (not shown) from which the UUT model 506 is derived. The simulator 508 would provide an input by which a user will inform the simulator 508 that a testcase is to be used, and direct the simulator 508 to provide random irritation to the UUT model 506. The simulator 508 and/or the pattern generator 502 would be required to contain the necessary instructions to carry out the automated sequence by which random irritation will occur. In a preferred mode of operation, when the simulator 508 is initiated, the simulator 508 calls the extractor 510 used for extracting the inputs and/or outputs of a UUT represented by the UUT model 506. When the simulator 508 calls the extractor 510, the simulator 508 will pass to the extractor 510 the path to hardware description language files or similar files that describe the logic of the UUT model 506. The extractor 510 extracts the inputs and/or outputs of a UUT represented by the UUT model 506 from such hardware description files or similar files, and creates an I/O file (not shown). The I/O file lists the inputs, followed by a separator, and then list the outputs. This order can be changed, however, without departing from the spirit of the present invention. The I/O file will be input to the pattern generator 502 and/or the simulator 508. It is noted herein that no software environment such as the software environment 410 of FIG. 4 is necessary when the pattern generator 502 is subsumed in the simulator 508 as shown in FIG. 5.

When the pattern generator 502 and/or simulator 508 acknowledges the completion of creating the I/O file, the simulator 508 will start the simulation of the UUT model 506. The pattern generator 502 accesses the I/O file, obtaining the UUT's inputs and outputs. The pattern generator 502 also loads the rules list 504. Preferably, the pattern generator 502 creates a seed (not shown), which it will use when generating random data patterns. The seed will be saved in an output file (not shown) of the simulator, for the purpose of recreating the data patterns used in the current simulation. Optionally, the output file may also be accessed by the pattern generator 502. The aforementioned features of the rules list 404 is also applicable to the rules list 504.

For each event of the simulation, the simulator 508 will prompt the pattern generator 502 to generate a data pattern. Then, the pattern generator 502 will parse the rules list 504. For each rule (not shown) listed in the rules list 504, net names affected by the rule will be assigned a value dictated by the rule. For the remaining nets not associated with a rule, random values will be created. The pattern generator 502 will pass to the simulator 508 this data pattern and corresponding input signals of a UUT represented by the UUT model 506.

Preferably, the pattern generator 502 will translate the data pattern and corresponding input signals into the language of the simulator 508, so that the simulator 508 does not have to interpret any of these commands itself. Once the simulator 508 receives the data pattern, it will apply the data pattern to the corresponding signals of the UUT. The simulator 508 will inform the pattern generator 502 when the simulator 508 requests another data pattern, and the process of data pattern generation will repeat. Since the pattern generator 502 already has the inputs and/or outputs of the UUT as well as the rules list 504, loading those files may not be necessary. Only a data pattern need be generated and passed to the simulator 508. Any simulator output information can be recorded in the output file or other files not shown in FIG. 5. Also, the data patterns generated by the pattern generator 502 may be input to the output file.

Figure 6:
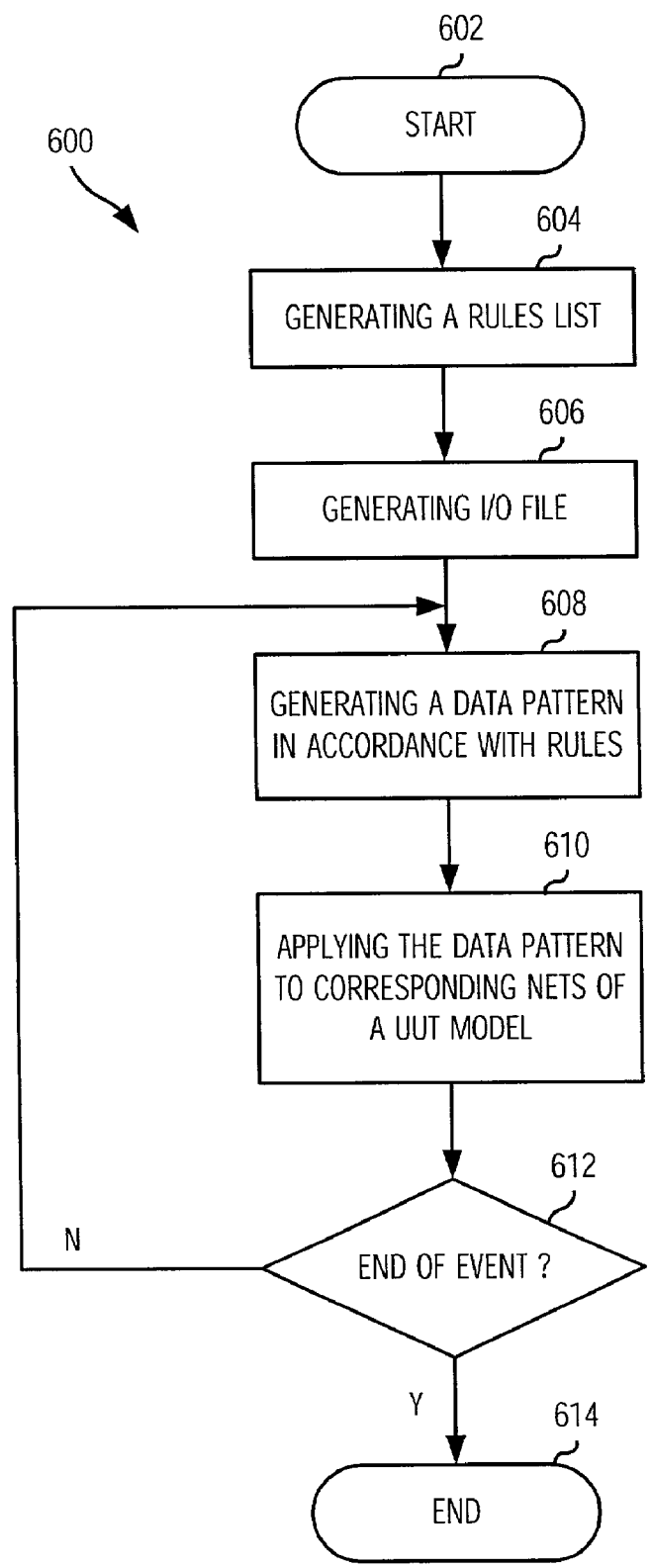
FIG. 6 depicts a flow diagram showing the process of rule-based random irritation of a UUT model.

In FIG. 6, a flow diagram 600 is shown to describe the functional flow of rule-based random irritation of a UUT model, such as the UUT models 406 and 506. At step 602, the process of rule-based random irritation starts. At step 604, a rules list such as the rules list 404 and 504 is generated. The rules list may be generated either manually or by a computer program specifically designed for the task. As mentioned above, the rules list provides restrictions or encouragements on how data patterns are to be applied to a UUT model. At step 606, an I/O file is generated. The I/O file contains a list of inputs and outputs of a UUT. Preferably, the inputs and outputs are specified in hardware description language files.

Steps 608, 610 and 612 constitute a loop for each event of a simulation. These steps will be performed once for each event of a simulation, and will be repeated for subsequent events, until there are no events left. An event is usually a cycle (from time base unit x to time base unit x+1) or can constitute a time duration, or any other way of keeping track of discrete simulation occurrences. An event may also be defined as the UUT input/output signals matching that of a pre-determined state. The rules list may or may not specify the number or type of event(s). At step 608, a pattern generator, such as the pattern generators 402 and 502, generates a data pattern in accordance with the rules provided by the rules list generated at step 604. A data pattern is generated for every input listed in the I/O file generated at step 606. Preferably, the data pattern generated at step 608 is provided to a simulator, such as the simulators 408 and 508.

At step 610, a simulator, such as the simulators 408 and 508, applies the data pattern to corresponding nets of the UUT model. At step 612, it is determined whether all events of the simulation are performed. Preferably, a stop command will be issued to the simulator if all events are performed. In any case, if there are no more events to be performed, the process ends at step 614. Otherwise, another event will be performed at step 608, wherein the same process comprising steps 608, 610, and 612 repeats until all events are exhausted.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

What is claimed is:

1. A computer program product for rule-based random irritation of a UUT model in a simulation of a UUT, the UUT model being a software model of the UUT, the computer program product having a computer-readable medium with a computer program embodied thereon, the computer program comprising:

an extractor program code for extracting one or more inputs and one or more outputs of the UUT;

a pattern generator program code for generating data patterns to be applied to the UUT model in accordance with a rules list and information on the one or more inputs and the one or more outputs of the UUT, the rules list providing restrictions or encouragements on how the data patterns are to be applied to the UUT model;

a simulator program code for applying the data patterns to the UUT model; and a software environment program code for interfacing communications between the extractor program code, the pattern generator program code, and the simulator program code.

2. The computer program product of claim 1, wherein the extractor program code generates a first computer file containing information on the one or more inputs and the one or more outputs of the UUT.

3. The computer program product of claim 1, wherein the software environment program code calls the extractor program code and provides the extractor program code with the paths to a plurality of computer files that describe the logic of the UUT, and wherein the extractor program code uses the plurality of the computer files to extract the one or more inputs and the one or more outputs of the UUT.

4. The computer program product of claim 1, wherein the software environment program code calls the extractor and provides the extractor with the paths to a plurality of computer files that describe the logic of the UUT, wherein the extractor program code uses the plurality of the computer files to extract the one or more inputs and the one or more output of the UUT, and wherein the plurality of computer files are in hardware description language.

5. The computer program product of claim 1, wherein the simulation comprises one or more events, and for each event, the software environment program code prompts the pattern generator program code to generate a data pattern, and the software environment program code interprets the data pattern and passes the data pattern so interpreted to the simulator.

6. The computer program product of claim 1, wherein the simulation comprises one or more events, and for each event, the software environment program code prompts the pattern generator program code to generate a data pattern, and the software environment program code interprets the data pattern and passes the data pattern so interpreted to the simulator, and wherein, when prompted by the software environment program code, for each rule listed in the rules list, the pattern generator assigns a value dictated by the rule to nets affected by the rule, and, for the remaining nets not associated with a rule in the rules list, creates random values.

7. A computer program product for rule-based random irritation of a UUT model, the UUT model being a software model of a UUT, the computer program product having a computer-readable medium with a computer program embodied thereon, the computer program comprising:

an extractor program code for extracting one or more inputs and one or more outputs of the UUT;

a pattern generator program code for generating data patterns to be applied to the UUT model in accordance with a rules list and information on the one or more inputs and the one or more outputs of the UUT, the rules list providing restrictions or encouragements on how the data patterns are to be applied to the UUT model; and a simulator program code for applying the data patterns to the UUT model, the simulator program code includes the pattern generator program code.

8. The computer program product of claim 7, wherein the extractor program code generates a first computer file containing information on the one or more inputs and the one or more outputs of the UUT.

9. The computer program product of claim 7, wherein the simulator program code calls the extractor program code and provides the extractor program code with the paths to a plurality of computer files that describe the logic of the UUT, and wherein the extractor program code uses the plurality of the computer files to extract the one or more inputs and the one or more outputs of the UUT.

10. The computer program product of claim 7, wherein the simulator program code calls the extractor program code and provides the extractor program code with the paths to a plurality of computer files that describe the logic of the UUT, and wherein the extractor program code uses the plurality of the computer files to extract the one or more inputs band the one or more outputs of the UUT, and wherein the plurality of computer files are in hardware description language.

11. The computer program product of claim 7, wherein the simulation comprises one or more events, and for each event, the simulator program code prompts the pattern generator program code to generate a data pattern, and the pattern generator program code passes the data pattern to the simulator program code in the language of the simulator.

12. The computer program product of claim 7, wherein the simulation comprises one or more events, and for each event, the simulator program code prompts the pattern generator program code to generate a data pattern, and the pattern generator program code passes the data pattern to the simulator program code in the language of the simulator program code, and wherein, when prompted by the simulator program code, for each rule listed in the rules list, the pattern generator program code assigns a value dictated by the rule to nets affected by the rule, and, for the remaining nets not associated with a rule in the rules list, creates random values.

13. A method implemented on one or more computers for rule-based random irritation of a UUT model in a simulation of a UUT, the UUT model being a software model of the UUT, the simulation having one or more events, the method comprising the steps of:

generating a rules list, the rules list providing information on how the data patterns are to be applied to the UUT model;

generating a data pattern, for an event of the simulation, in accordance with the rules list and information on one or more inputs and one or more outputs of the UUT;

performing each event by applying the respective data pattern to the UUT model; and determining whether all events of the simulation are performed.

14. The method of claim 13, further comprising the steps of:

ending the simulation, if all events of the simulation are performed; and repeating the steps of generating a data pattern, performing each event, and determining whether all events of the simulation are performed, if all events of the simulation are not performed.

15. The method of claim 13, further comprising the step of generating an I/O file containing information on one or more inputs and one or more outputs of the UUT.

16. The method of claim 13, further comprising the steps of:

calling an extractor program code for extracting one or more inputs and one or more outputs of the UUT and generating a first computer file containing information on the one or more inputs and the one or more output of the UUT; and providing the extractor program code with the paths to a plurality of computer files that describe the logic of the UUT, and wherein the extractor program code uses the plurality of the computer files to extract the one or more inputs and the one or more outputs of the UUT.

17. The method of claim 13, further comprising the steps of:
  prompting to generate the data pattern;
  interpreting the data pattern; and
  passing the data pattern to a simulator performing the simulation.

18. The method of claim 13, further comprising the steps of:
  prompting to generate the data pattern;
  interpreting the data pattern;
  passing the data pattern to a simulator performing the simulation;
  assigning, for each rule contained in the rules list, a value to nets affected by the rule, and, for the remaining nets not associated with a rule in the rules list, creating random values.

19. A computer-based apparatus for rule-based random irritation of a UUT model in a simulation of a UUT, the UUT model being a software model of the UUT, the apparatus comprising:
  means for generating a rules list, the rules list providing information on how the data patterns are to be applied to the UUT model;
  means for generating a data pattern, for an event of the simulation, in accordance with the rules list and information on one or more inputs and one or more outputs of the UUT;
  means for performing each event by applying the respective data pattern to the UUT model; and
  means for determining whether all events of the simulation are performed.

20. The apparatus of claim 19, further comprising means for generating an I/O file containing information on one or more inputs and one or more outputs of the UUT.

21. The apparatus of claim 19, further comprising:
  means for calling an extractor program code for extracting one or more inputs and one or more outputs of the UUT and generating a first computer file containing information on the one or more inputs and the one or more output of the UUT; and
  means for providing the extractor program code with the paths to a plurality of computer files that describe the logic of the UUT, and wherein the extractor program code uses the plurality of the computer files to extract the one or more inputs and the one or more outputs of the UUT.

22. The apparatus of claim 19, further comprising:
  means for prompting to generate the data pattern;
  means for interpreting the data pattern; and
  means for passing the data pattern to a simulator performing the simulation.

23. The apparatus of claim 19, further comprising:
  means for prompting to generate the data pattern;
  means for interpreting the data pattern;
  means for passing the data pattern to a simulator performing the simulation;
  means for assigning, for each rule contained in the rules list, a value to nets affected by the rule, and, for the remaining nets not associated with a rule in the rules list, creating random values.

24. A computer program product for rule-based random irritation of a UUT model in a simulation of a UUT, the UUT model being a software model of the UUT, the computer program product having a computer-readable medium with a computer program embodied thereon, the computer program comprising:
  an extractor program code for extracting one or more inputs and one or more outputs of the UUT, wherein the extractor program code generates a first computer file containing information on the one or more inputs and the one or more outputs of the UUT;
  a pattern generator program code for generating data patterns to be applied to the UUT model in accordance with a rules list and information on the one or more inputs and the one or more outputs of the UUT, the rules list providing restrictions or encouragements on how the data patterns are to be applied to the UUT model;
  a simulator program code for applying the data patterns to the UUT model, wherein the simulation comprises one or more events, and for each event, the software environment program code prompts the pattern generator program code to generate a data pattern, and the software environment program code interprets the data pattern and passes the data pattern so interpreted to the simulator, and wherein, when prompted by the software environment program code, for each rule listed in the rules list, the pattern generator assigns a value dictated by the rule to nets affected by the rule, and, for the remaining nets not associated with a rule in the rules list, creates random values; and
  a software environment program code for interfacing communications between the extractor program code, the pattern generator program code, and the simulator program code, wherein the software environment program code calls the extractor and provides the extractor with the paths to a plurality of computer files that describe the logic of the UUT, wherein the extractor program code uses the plurality of the computer files to extract the one or more inputs and the one or more output of the UUT, and wherein the plurality of computer files are in hardware description language.

* * * * *